(12) United States Patent
Chang (10) Patent No.: US 7,022,591 B2
(45) Date of Patent: Apr. 4, 2006

(54) METHOD OF FABRICATING A POLYSILICON THIN FILM

(75) Inventor: Mao-Yi Chang, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 142 days.

(21) Appl. No.: 10/709,008

(22) Filed: Apr. 7, 2004

(65) Prior Publication Data

US 2004/0248345 A1 Dec. 9, 2004

(30) Foreign Application Priority Data

Jun. 5, 2003 (TW) .................................. 92115200 A (51) Int. Cl.
*H01L 21/20* (2006.01)

(52) U.S. Cl. ...................... 438/482; 438/486; 438/488
(58) Field of Classification Search ................ 438/478, 438/479, 482, 486, 487, 488
See application file for complete search history.

(56) References Cited

U.S. PATENT DOCUMENTS 6,593,215 B1 * 7/2003 Mori et al. ................. 438/486
6,677,222 B1 * 1/2004 Mishima et al. ............ 438/488
2002/0115245 A1   8/2002 Chang et al.
2004/0038438 A1 * 2/2004 Shih et al. .................... 438/30
2004/0055999 A1 * 3/2004 Chen et al. .................. 216/57
2004/0058076 A1 * 3/2004 Peng ........................ 427/376.2
2004/0201023 A1 * 10/2004 Yamazaki et al. ............ 257/75

OTHER PUBLICATIONS

Brotherton et al., Excimer–Laser–Annealed Poly–Si Thin–Film Transistors in *IEEE Transactions On Electron Devices*, vol. 40, No. 2, pp. 407–413, Feb. 1993.

Zeng et al., A Novel Two–Step Laser Crystallization Technique for Low–Temperature Poly–Si TFTs in *IEEE Transactions On Electron Devices*, vol. 48, No. 5, pp. 1008–1010, May 2001.

* cited by examiner

*Primary Examiner*—Ha Tran Nguyen
*Assistant Examiner*—Scott B. Geyer
(74) *Attorney, Agent, or Firm*—Jianq Chyun IP Office (57) ABSTRACT

The present invention uses higher protrusions of an initially formed silicon layer as crystalline seeds in the subsequent crystallization step so that the newly-formed polysilicon thin film has smoother and bigger silicon grains, and has lesser density of protrusions. Furthermore, the polysilicon thin film of the present invention can be applied to form polysilicon thin film transistors or other devices.

21 Claims, 6 Drawing Sheets

METHOD OF FABRICATING A POLYSILICON THIN FILM

CROSS REFERENCE TO RELATED APPLICATIONS

This application claims the priority benefit of Taiwan application serial no. 92115200, filed Jun. 5, 2003.

BACKGROUND OF INVENTION

1. Field of the Invention

This invention generally relates to a method of fabricating a thin film transistor liquid crystal display ("TFT-LCD"), and more particularly to a method of fabricating a polysilicon thin film for the thin film transistor array in the liquid crystal display.

2. Description of the Related Art

Polysilicon and amorphous silicon are two types of materials used for fabricating TFT for active matrix LCD panels. Polysilicon TFT has a higher aperture rate and a lower cost than the amorphous silicon TFT. The larger and uniform silicon grains of polysilicon allow electrons to flow more freely than through amorphous silicon, which is made up of smaller and random sized silicon grains. It allows the normally external driver chips to be fabricated on the glass substrate that dramatically reduces row and column connections. Hence, polysilicon TFT technology can effectively reduce the device size in order to achieve higher integration. Generally, the requirements for mass production of polysilicon TFT are low temperature polysilicon ("LTPS") technology (450–550° C.), low temperature film-forming technology for the isolating film of gate terminal, and ion implantation for large area.

For application to active matrix liquid crystals displays, a low temperature process for the production of polycrystalline silicon is required to permit the use of inexpensive glass substrates. This would allow the integration of drive electronics into the display panel. Current low temperature process include solid phase crystallization ("SPC") and excimer laser crystallization ("ELC"). Solid phase crystallization requires high temperatures (600° C.) and the result of the crystallization is not very good. Excimer laser crystallization technology applies the excimer laser is excimer laser crystallization or excimer laser annealing ("ELA") process to fuse the amorphous silicon thin film and make it recrystillize to a polysilicon thin film.

Because the ELC process can be carried out at a temperature lower than 450° C., resulting in a higher electron migration rate and a lower leakage current than the SPC process, it can be applied to an inexpensive glass substrate. Therefore, the production costs can be reduced.

Figure 1A:
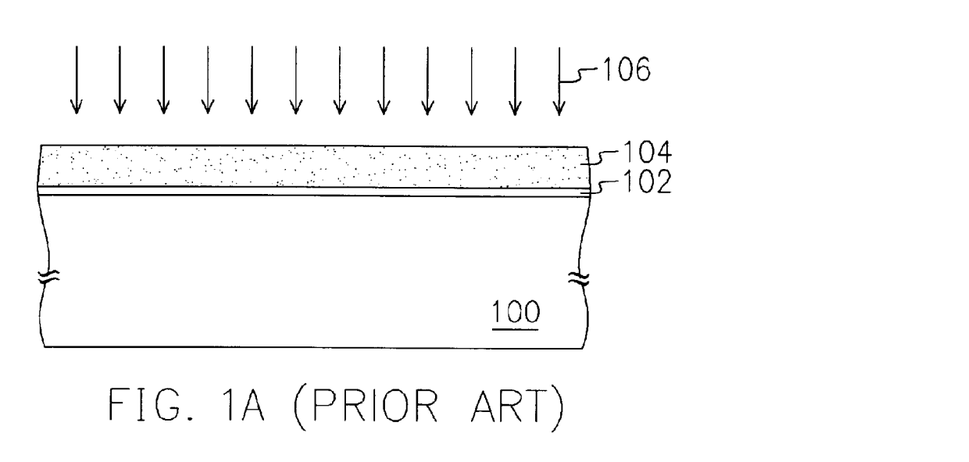
FIGS. 1A–1B show the fabrication process of a conventional polysilicon thin film.
Figure 1B:
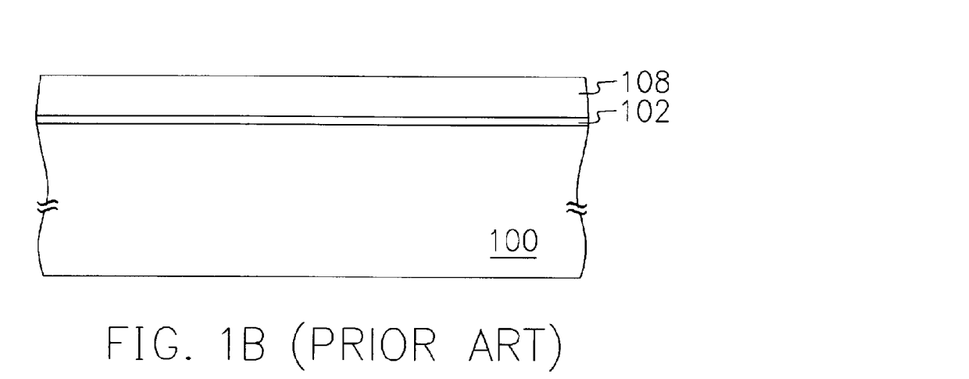

FIGS. 1A–1B show the fabrication process of a conventional polysilicon thin film. Referring to FIG. 1A, a substrate 100 having an isolating layer 102 formed thereon is provided. Then a smooth amorphous silicon layer 104 is formed on the isolating layer 102. After the amorphous silicon layer 104 is deposited, the excimer laser 106 with enough energy is applied to substantially fuse the amorphous silicon layer 104; i.e., there are some unfused silicon grains left on the surface of the isolating layer 102 as discrete seeds (not shown in FIG. 1A).

Referring to FIG. 1B, the fused amorphous silicon layer 104 uses the unfused silicon grains as discrete seeds to crystallize into a polysilicon layer 108, which is used for drain region, source region, and channel region of the TFT.

The conventional process of forming polysilicon thin films has to precisely control the power of the excimer laser in order to make some unfused amorphous silicon grains left as discrete seeds for better crystallization. However, the excimer laser is a pulsed laser. The power density of each pulse would be different and thus is difficult to control. As a result, the size of silicon grains left would be different; the silicon grains would comprise protrusions at their boundaries reflecting a poor smoothness of the polysilicon thin film, which would adversely affect the TFT devices.

SUMMARY OF INVENTION

An object of the present invention is to provide a method of fabricating a polysilicon thin film for forming a bigger silicon grain and reducing the amount and the density of the protrusions in order to achieve a smoother polysilicon thin film for the TFT devices.

The present invention provides a method of fabricating a polysilicon thin film, comprising: forming a first solid phase silicon layer on a substrate, wherein said solid phase silicon layer has a plurality of first protrusions with different heights, wherein the maximum distance between the top of said first protrusions and the surface of said substrate is $X_1$, and the minimum distance between the top of said first protrusions and the surface of said substrate is $Y_1$; liquidizing a portion of said first solid phase silicon layer to liquidize a thickness of $Z_1$ of said first solid phase silicon layer, wherein $Y_1 < Z_1 < X_1$, and a portion of said first protrusions having a distance which is between the top of said first protrusions and the surface of said substrate and larger than $Z_1$ is not liquidized and become a plurality of silicon grains; and performing crystallization using said silicon grains as crystalline seeds. The present invention also provides a method of fabricating a polysilicon thin film, comprising: forming a first polysilicon layer on a substrate, wherein said first polysilicon layer has a plurality of first protrusions with different heights, and the maximum distance between the top of said first protrusions and the surface of said substrate is $X_2$, and the minimum distance between the top of said protrusions and the surface of said substrate is $Y_2$; etching a portion of said first polysilicon layer to remove said first protrusions and said first polysilicon layer having a thickness of $Z_2$ to form a plurality of second protrusions on said substrate, wherein $Y_2 < Z_2 < X_2$ and the number of said second protrusions is less than the number of said first protrusions; forming a first amorphous silicon layer on said substrate and said second protrusions; and performing a first annealing process to crystallize to form a second polysilicon layer by using said second protrusions as crystalline seeds.

Accordingly, the present invention uses higher protrusions of an initially formed silicon layer as crystalline seeds for the subsequent crystallization step so that the newly-formed polysilicon thin film has smoother and bigger silicon grains, and has lesser density of protrusions. Furthermore, the polysilicon thin film of the present invention can be applied to form polysilicon thin film transistors or other devices.

The above is a brief description of some deficiencies in the prior art and advantages of the present invention. Other features, advantages and embodiments of the invention will be apparent to those skilled in the art from the following description, accompanying drawings and appended claims.

DETAILED DESCRIPTION

<First embodiment>

FIGS. 2A–2F are the cross-sectional views of the first embodiment of the process of fabricating a polysilicon thin film in accordance with the present invention.

Figure 2A:
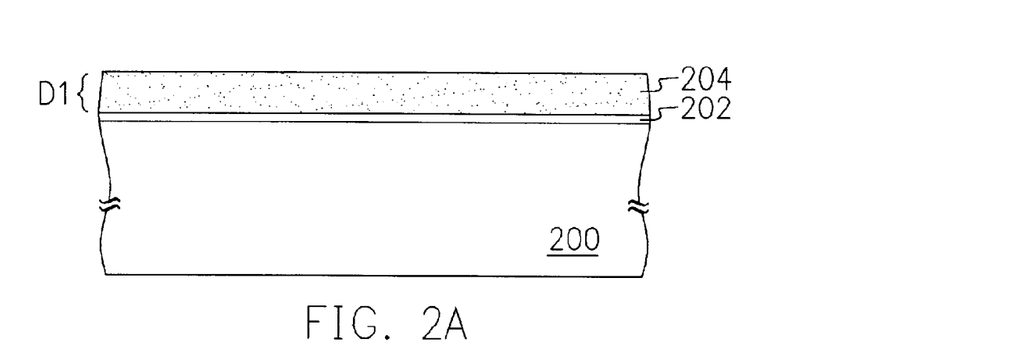
FIGS. 2A–2F are the cross-sectional views of a process of fabricating a polysilicon thin film in accordance with a first embodiment of the present invention.

Referring to FIG. 2A, a substrate 200 is provided; the substrate 200 can be a silicon substrate, a glass substrate or a plastic substrate. Then an isolating layer 202 is formed on the substrate 200; the isolating layer material may include silicon dioxide. The isolating layer 202 can be formed by a low pressure chemical vapor deposition ("LPCVD"), a plasma enhanced chemical vapor deposition ("PECVD") or a sputter. Next, an amorphous silicon layer 204 is formed on the isolating layer 202; the amorphous silicon layer 204 can be formed by a LPCVD, a PECVD or a sputter, wherein amorphous silicon layer 204 has a thickness of D1 approximately between 1 nm and 1000 nm.

Figure 2B:
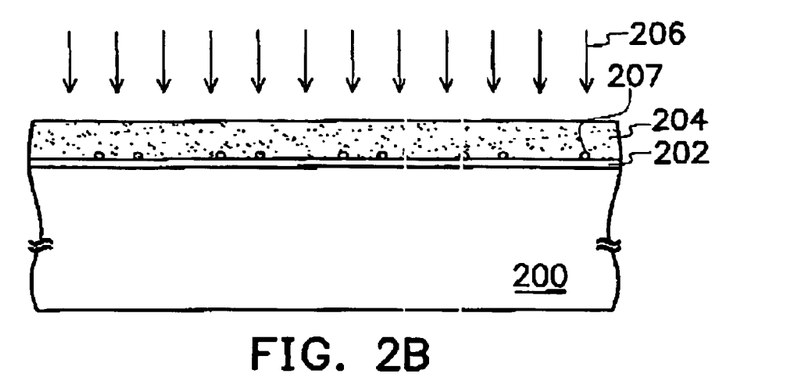

Referring to FIG. 2B, a first annealing process 206 is performed, wherein the first annealing process 206 is performed by applying excimer laser to the amorphous silicon layer 204 to fuse most part of the entire amorphous silicon layer 204 but there would be some amorphous silicon grains 207 left on the surface of the isolating layer 202 as the crystallization seeds (nucleation site) for crystallization.

Figure 2C:
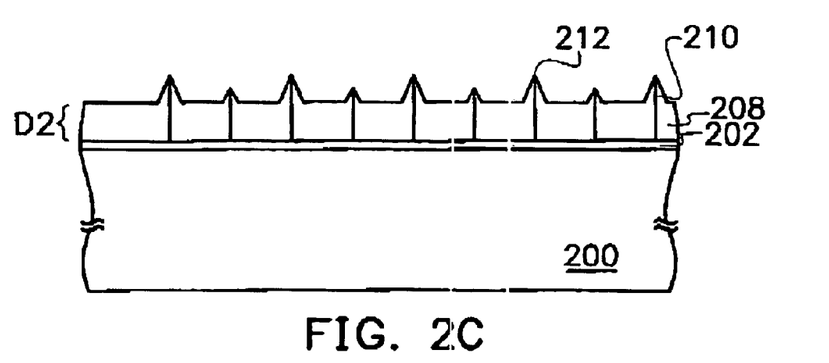

Referring to FIG. 2C, the fused portion of the amorphous silicon layer 204 uses the unfused amorphous silicon grains 207 as crystallization seeds to crystallize and then a polysilicon layer 208 having a thickness of D2 is formed; wherein D1 is approximately between 1 nm and 1000 nm. As shown in FIG. 2C, during the crystallization process, the silicon grains will continue to grow laterally until they contact to the neighboring silicon grains. Furthermore, the boundary 210 between the silicon grains will become protrusions 212 because the neighboring silicon grains push against each other. Generally, the heights of those protrusions 212 will distribute in a different way based on the distance between the two neighboring silicon grains, the temperature of the amorphous silicon layer 204 after the excimer laser is applied, or the growth rate of the silicon grains.

Figure 2D:
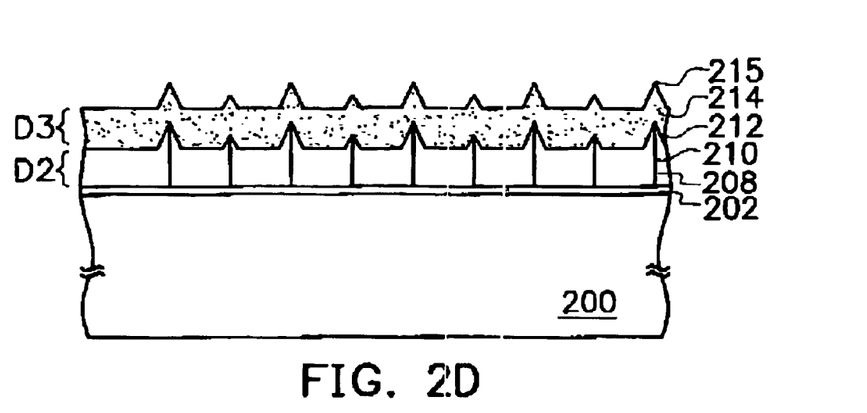

Referring to FIG. 2D, an amorphous silicon layer 214 is formed on the crystallized polysilicon layer 208; the amorphous silicon layer 214 can be formed by a LPCVD, a PECVD or a sputter, wherein the amorphous silicon layer 214 has a thickness of D3; wherein D3 is approximately between 1 nm and 1000 nm. Furthermore, as shown in FIG. 2D, the amorphous silicon layer 214 also has protrusions 215 corresponding to the protrusions 212. Among those protrusions 215, the maximum distance between the top of the protrusions 215 and the isolating layer 202 is $X_1$ (not shown in FIG. 2D), and the minimum distance between the top of the protrusions 215 and the isolating layer 202 is $Y_1$ (not shown in FIG. 2D).

Figure 2E:
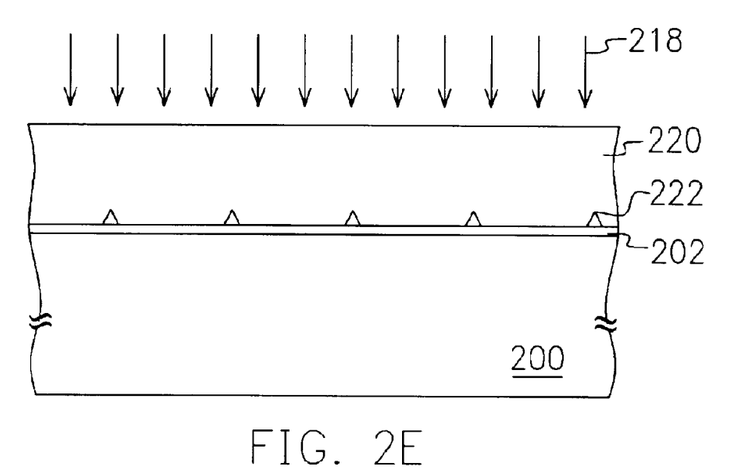

As shown in FIG. 2E, a second annealing process 218 is performed, wherein the second annealing process 218 can be performed by applying the excimer laser to a portion of the amorphous silicon layer 214 to liquidize the amorphous silicon layer 214 and the polysilicon layer 208 to become a liquid silicon layer 220; there are still some unfused silicon grains 222 left on the surface of the isolating layer 202. The energy density of the excimer laser depends on the heights of the amorphous silicon layer 214, the polysilicon layer 208, and the protrusions 215. By controlling the energy density of the excimer laser, a thickness lower than $Z_1$ of the amorphous silicon layer 214 and the polysilicon layer 208 is fused in part, wherein $Y_1 < Z_Z < X_1$. At the same time, the portion of the protrusions 215 with the distance, which is between the top of the protrusions 215 and the substrate 200 and higher than $Z_1$, are not fused completely and become a plurality of silicon grains 222. The number of the silicon grains 222 is less than that of the protrusions 212.

The protrusions 215 having a distance less than $Z_1$, between the top of the protrusions 215 and the isolating layer 202, will be totally fused by the excimer laser, but the protrusions 215 having a distance more than $Z_1$, between the top of the protrusions 215 and the isolating layer 202, will become the silicon grains 222. This is because the polysilicon layer 208 with a thickness of $(X_1-Z_1)$ can be unfused.

Figure 2F:
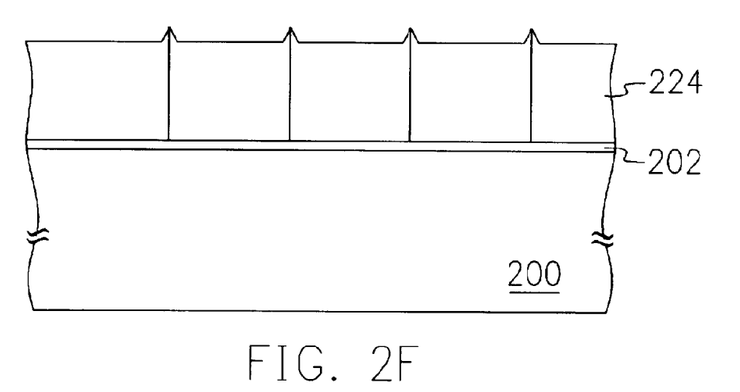

Referring to FIG. 2F, the crystallization process is performed. The liquid silicon layer 220 uses the silicon grains 222 as crystalline seeds to form the polysilicon layer 224.

<Second embodiment>

FIGS. 3A–3G are the cross-sectional views of a process of fabricating a polysilicon thin film in accordance with a second embodiment of the present invention.

Figure 3A:
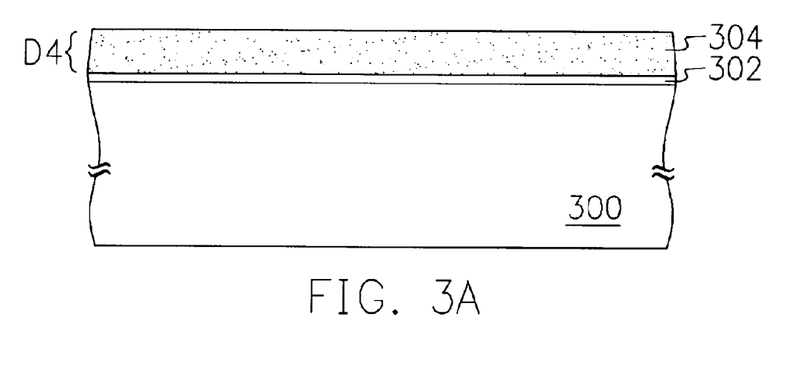
FIGS. 3A–3G are the cross-sectional views of a process of fabricating a polysilicon thin film in accordance with a second embodiment of the present invention.

Referring to FIG. 3A, a substrate 300 is provided; the substrate 300 can be a silicon substrate, a glass substrate or a plastic substrate. Then an isolating layer 302 is formed on the substrate 300; the isolating layer material can be silicon dioxide. The isolating layer 302 can be formed by using a LPCVD, a PECVD or a sputtering method. Later, an amorphous silicon layer 304 is formed on the isolating layer 302; the amorphous silicon layer 304 can be formed by using a LPCVD, a PECVD or a sputtering method, wherein amorphous silicon layer 304 has a thickness of D4; wherein D4 is approximately between 1 nm and 1000 nm.

Figure 3B:
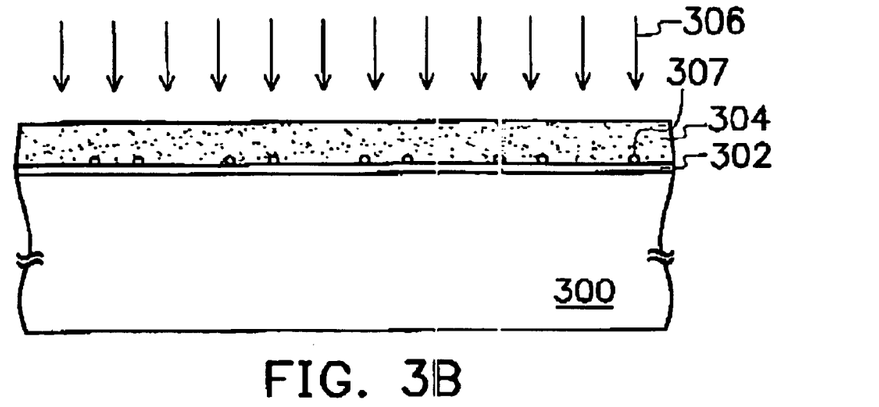

Referring to FIG. 3B, a first annealing process 306 is performed, wherein the first annealing process 306 is performed by applying excimer laser to the amorphous silicon layer 304 to fuse most of the amorphous silicon layer 304 but there would be some amorphous silicon grains 307 left on the surface of the isolating layer 302 as the crystallization seeds (nucleation site) for crystallization.

Figure 3C:
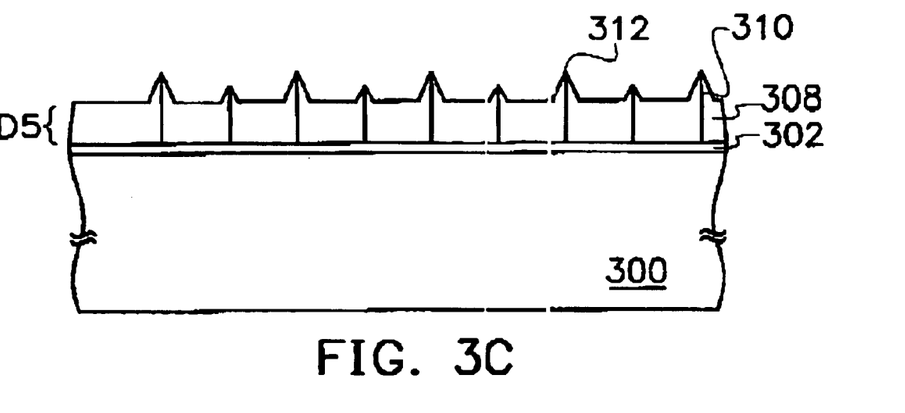

Referring to FIG. 3C, the fused portion of the amorphous silicon layer 304 uses the unfused the amorphous silicon grains 307 as crystallization seeds to crystallize and then form a polysilicon layer 308 having a thickness of D5; wherein D5 is approximately between 1 nm and 1000 nm. As shown in FIG 3C, during crystallization process, the silicon grains will continue to grow laterally until they come in contact with the neighboring silicon grains. Furthermore, the boundary 310 between the silicon grains will form protrusions 312 because the neighboring silicon grains push against each other. Generally, the heights of those protrusions 312 will distribute in a different way based on the distance between the two neighboring silicon grains, the temperature of the amorphous silicon layer 304 after the excimer layer is applied, or the growth rate of the silicon grains. Among those protrusions 312, the maximum distance between the top of the protrusions 312 and the isolating layer 302 is $X_1$ (not shown in FIG. 3C), and the minimum distance between the top of the protrusions 312 and the isolating layer 302 is $Y_1$ (not shown in FIG. 3C).

Figure 3D:
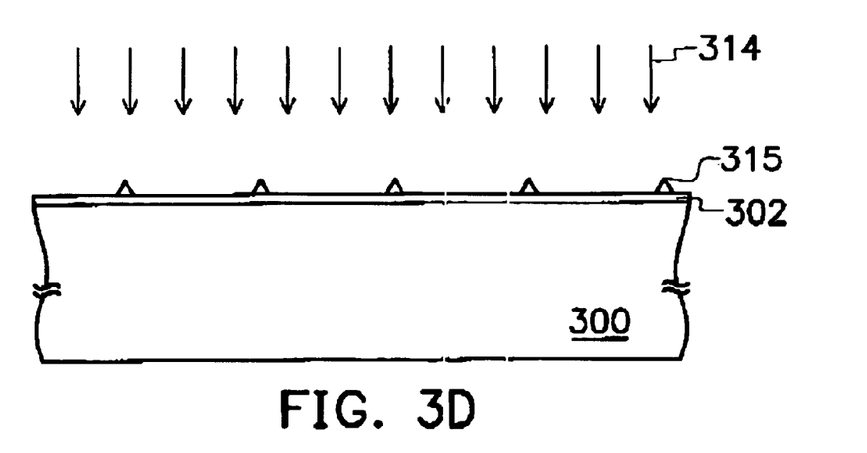

Referring to FIG. 3D, an etching process 314 is performed to remove the portion of polysilicon layer 308 having a thickness less than $Z_2$, wherein the etching is performed by using an anisotropic etching and $Y_2<Z_2<X_2$.

The polysilicon layer 308 with the protrusions 312 having a distance, which is between the top of the protrusions 312 and the substrate 300 and less than $Z_2$, will be etched, but the polysilicon layer 308 with the protrusions 312 having a distance, which is between the top of the protrusions 312 and the substrate 300 and more than $Z_2$, will not be totally etched to form the silicon grains 315 on the surface of the substrate 300. The number of the silicon grains 315 is less than that of the protrusions 312.

Figure 3E:
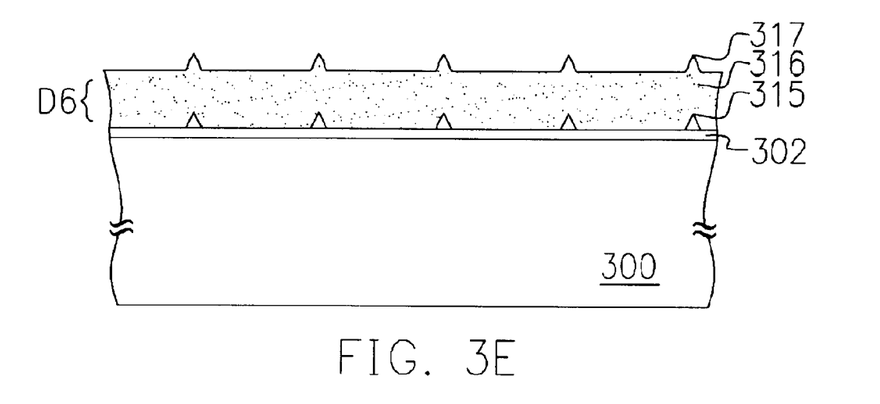

Referring to FIG. 3E, an amorphous silicon layer 316 is formed by a LPCVD, a PECVD or sputtering method, wherein the amorphous silicon layer 316 has a thickness of D3, which is approximately between 1 nm and 1000 nm. Furthermore, as shown is FIG. 3D, the amorphous silicon layer 316 also has protrusions 317 corresponding to the protrusions 315.

Figure 3F:
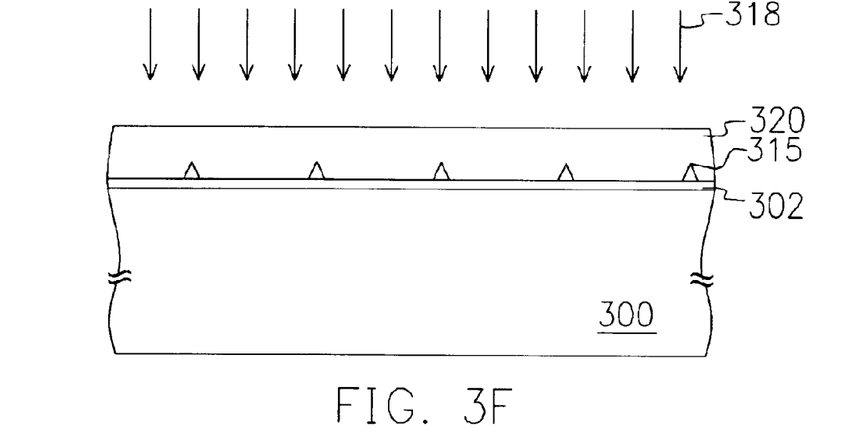

Referring to FIG. 3F, a second annealing process 318 is performed, wherein the second annealing process 318 is performed by applying the excimer laser to the amorphous silicon layer 316 to liquidize the amorphous silicon layer 316 to become a liquid silicon layer 320; there are unfused silicon grains 315 left on the surface of the isolating layer 302. The energy density of the excimer laser is controlled not to fuse the entire silicon grains 315 so that silicon grains 315 can be used as crystalline seeds.

Figure 3G:
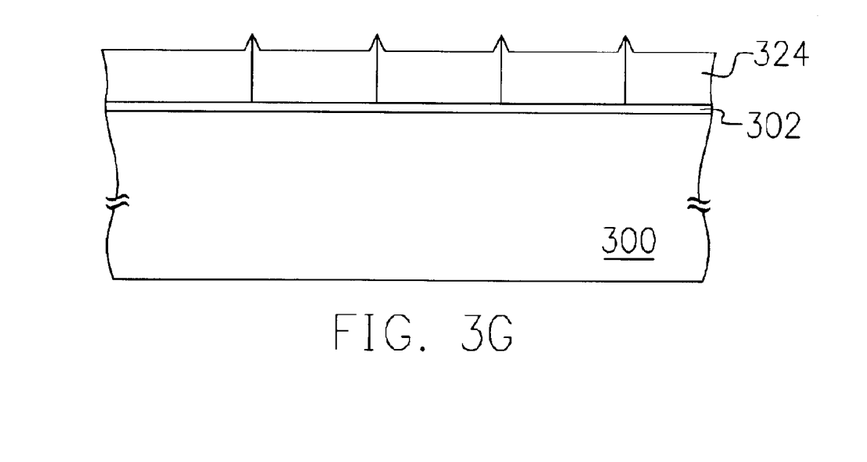

Referring to FIG. 3G, the crystallization process is performed. The liquid silicon layer 320 uses the silicon grains 315 as crystallization seeds to form the polysilicon layer 324.

In the first embodiment of the present invention, the polysilicon layer 208 and the amorphous silicon layer 214 in FIG. 2D can be deemed to be solid phase silicon layers; the excimer laser annealing process 218 to the amorphous silicon layer 214 in FIG. 2E can be deemed to be a liquidization process to the solid phase silicon layer.

Moreover, in the second embodiment of the present invention, the etching process 314 applied to the polysilicon 308 and the excimer laser annealing process 318 applied to the amorphous silicon layer 316 in FIG. 3D and FIG. 3F respectively can be deemed to be liquidization processes.

Figure 4:
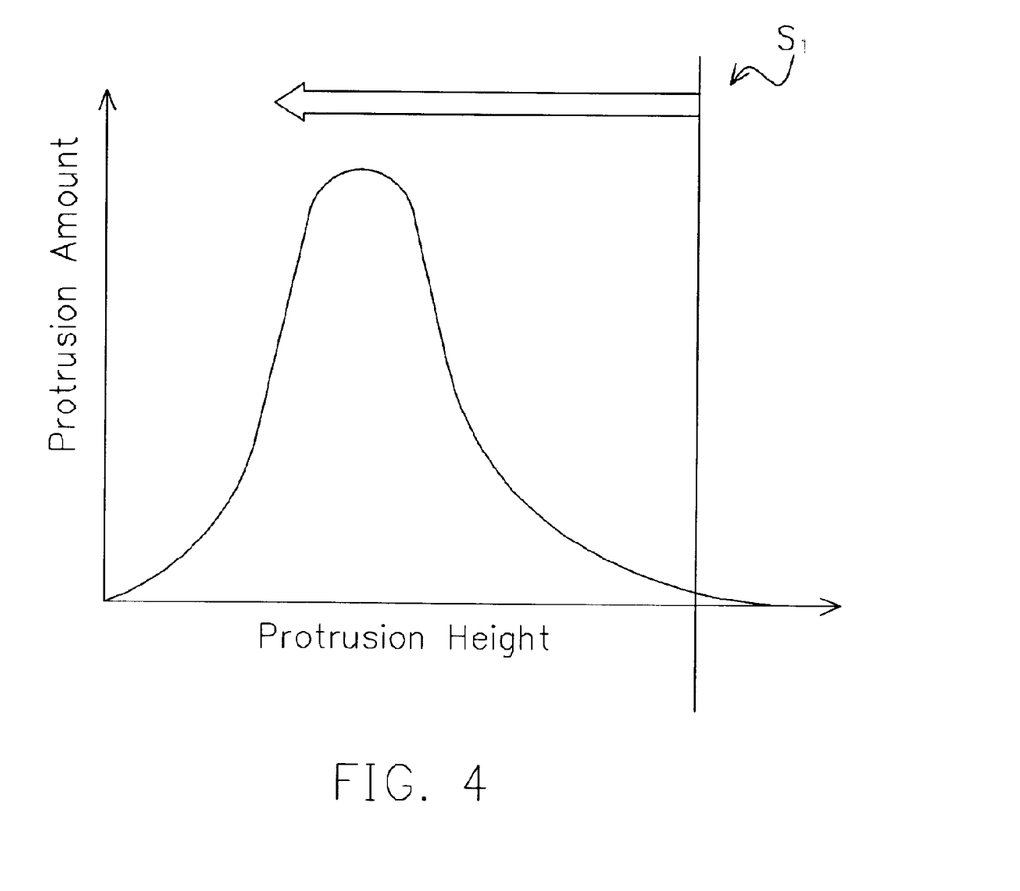
FIG. 4 shows the distribution of protrusion height vs. protrusion amount of the polysilicon layer in FIG. 2C and FIG. 3C in accordance with the present invention.

FIG. 4 shows the distribution of protrusions amount vs. protrusion height of the polysilicon layer in FIG. 2 and FIG. 3 in accordance with the present invention. According to FIG. 4, this curve is Gaussian distribution; i.e., for the protrusions, the more the heights get close to the average value, the larger the amount is. The present invention thus provides a way to grow bigger silicon grains and to produce fewer protrusions by rejecting the protrusions having a specific height. (e.g., the left side of S1 in FIG. 4) Then the present invention uses the remaining protrusions as crystallization seeds to grow bigger silicon grains to produce fewer protrusions. Hence, the method of the present invention provides a smoother polysilicon thin film for the TFT devices and can be applied to form thin film transistors for better electron mobility and less current leakage.

Accordingly, the present invention has the following advantages.

1. By applying an excimer laser annealing to an amorphous silicon layer deposed on a crystallized polysilicon, the amount and the density of the protrusions on the polysilicon layer can be effectively reduced. Next, the residual protrusions (silicon grains) are used as crystallization seeds to form a polysilicon layer having bigger silicon grains and better surface smoothness.

2. By etching the crystallized polysilicon layer and then depositing an amorphous silicon layer on it and performing the excimer laser annealing process, the protrusions of the polysilicon layer can be effectively reduced. The residual protrusions (silicon grains) then are used as crystalline seeds to form a polysilicon layer having a better surface smoothness.

3. The polysilicon thin film formed by the first and second embodiments can provide better electron mobility and less current leakage. Furthermore, the polysilicon thin film of the present invention also can be applied in other devices such as the driver circuits of COG process.

The above description provides a full and complete description of the preferred embodiments of the present invention. Various modifications, alternate construction, and equivalents may be made by the skill in the art without changing the scope or spirit of the invention. Accordingly, the above description and illustrations should not be construed as limiting the scope of the invention which is defined by the following claims.

What is claimed is:

1. A method of fabricating a polysilicon thin film, comprising:
   forming a first solid phase silicon layer having a plurality of first protrusions with different heights on a substrate, wherein the maximum distance between the top of said first protrusions and the surface of said substrate is X1, and the minimum distance between the top of said first protrusions and the surface is said substrate is Y1;
   reducing the density of the first protrusions such that a portion of said first protrusions having a distance which is between the top of said first protrusions and the surface of said substrate and larger than Z1 wherein Y1<Z1<X1, is retained and becomes a plurality of silicon grains; and
   performing a crystallization process using said silicon grains as crystalline seeds.

2. The method of fabricating a polysilicon thin film of claim 1, wherein said step of forming said first solid phase silicon layer comprises:
   forming a first polysilicon layer on said substrate, wherein said first polysilicon layer has a plurality of polysilicon protrusions with different heights; and
   forming a first amorphous silicon layer on said first polysilicon layer.

3. The method of fabricating a polysilicon thin film of claim 2, wherein the step of forming said first polysilicon layer comprises:
   forming a second amorphous silicon layer on said substrate;
   applying a laser power to said second amorphous silicon layer to fuse a portion of said second amorphous silicon layer, wherein said fused portion of said second amorphous silicon layer is a second liquid silicon layer, and said unfused portion of said second amorphous silicon layer forms a plurality of amorphous silicon grains; and
   crystallizing said second liquid silicon layer to form said first polysilicon layer by using said amorphous silicon grains as crystalline seeds.

4. The method of fabricating a polysilicon thin film of claim 2, wherein said step of reducing the density of the first protrusions comprises:
   applying a laser power to said first solid phase silicon layer to fuse a thickness of Z1 of said first solid phase silicon to be a first liquid silicon layer.

5. The method of fabricating a polysilicon thin film of claim 4, wherein said laser power is generated by an excimer laser.

6. The method of fabricating a polysilicon thin film of claim 4, further comprising lowering the temperature to crystallize said first liquid silicon layer to form said polysilicon thin film by using said silicon grains as crystallization seeds.

7. The method of fabricating a polysilicon thin film of claim 6, wherein the thickness of said first polysilicon layer is between 1 nm and 1000 nm.

8. The method of fabricating a polysilicon thin film of claim 6, further comprising forming an isolating layer between said substrate and said first polysilicon layer.

9. The method of fabricating a polysilicon thin film of claim 1, wherein said first solid phase silicon layer is a first polysilicon layer, and the step of forming said first polysilicon layer comprises:
   forming a second amorphous silicon layer on said substrate;
   applying a laser power to said second amorphous silicon layer to fuse a portion of said second amorphous silicon layer, wherein said fused portion of said second amorphous silicon layer is a second liquid silicon layer, and said unfused portion of said second amorphous silicon layer forms a plurality of amorphous silicon grains; and
   crystallizing said second liquid silicon layer to form said first polysilicon layer by using said amorphous silicon grains as crystallization seeds, wherein said first polysilicon layer has said a plurality of first protrusions with different heights.

10. The method of fabricating a polysilicon thin film of claim 9, wherein said step of reducing the density of the first protrusions comprises:
   etching said first solid phase silicon layer to make a thickness of Z1 of said first solid phase silicon layer.

11. The method of fabricating a polysilicon thin film of claim 10, wherein said etching step is anisotropic etching.

12. The method of fabricating a polysilicon thin film of claim 10, wherein after the step of reducing the density of the first protrusions, the method further comprises:
   forming a third amorphous silicon layer on said substrate and said silicon grains; and
   applying a laser power to said third amorphous silicon layer and said silicon grains to fuse said third amorphous silicon layer to become a third liquid silicon layer and said silicon grains are not fused completely.

13. The method of fabricating a polysilicon thin film of claim 12, further comprising:
   crystallizing said third liquid silicon layer to form said first polysilicon layer by using said silicon grains as crystalline seeds.

14. The method of fabricating a polysilicon thin film of claim 13, wherein the thickness of said first polysilicon layer is between 1 nm and 1000 nm.

15. The method of fabricating a polysilicon thin film of claim 9, further comprising forming an isolating layer between said substrate and said first polysilicon layer.

16. The method of fabricating a polysilicon thin film of claim 10, wherein said power is generated by an excimer laser.

17. A method of fabricating a polysilicon thin film, comprising:
   forming a first polysilicon layer on a substrate, wherein said first polysilicon layer has a plurality of first protrusions with different heights, and a maximum distance between the top of said first protrusions and the surface of said substrate is X1, and the minimum distance between the top of said first protrusions and the surface of said substrate is Y1;
   forming a first amorphous silicon layer on said first polysilicon layer;
   performing a first annealing process to liquidize the first amorphous silicon layer, said first polysilicon layer and said first protrusions having a thickness of Z1 to form a plurality of second protrusions, wherein Y1<Z1<X1 and the number of said second protrusions is less than the number of said first protrusions; and
   performing a crystallization process using said second protrusions as crystallization seeds to form a second polysilicon layer.

18. The method of fabricating a polysilicon thin film of claim 17, wherein said step of forming said first polysilicon layer comprises:
   forming a second amorphous silicon layer on said substrate;
   performing a second annealing process to fuse a portion of said second amorphous silicon layer, wherein the unfused portion of said second amorphous silicon layer is amorphous silicon grains set on the surface of said substrate; and
   using said amorphous silicon grains as crystalline seeds to perform crystallization to form said first polysilicon layer.

19. The method of fabricating a polysilicon thin film of claim 17, further comprising forming an isolating layer between said substrate and said first polysilicon layer.

20. A method of fabricating a polysilicon thin film, comprising:
   forming a first polysilicon layer on a substrate, wherein said first polysilicon layer has a plurality of first protrusions with different heights, and the maximum distance between the top of said first protrusions and the surface of said substrate is X2, and the minimum distance between the top of said first protrusions and the surface of said substrate is Y2;
   etching a portion of said first polysilicon layer to remove said first protrusions and said first polysilicon layer having a thickness of Z2 to form a plurality of second protrusions on said substrate, wherein Y2<Z2<X2 and the number of said second protrusions is less than the number of said first protrusions;
   forming a first amorphous silicon layer on said substrate and said second protrusions; and
   performing a first annealing process to crystallize to form a second polysilicon layer by using said second protrusions as crystalline seeds.

21. The method of fabricating a polysilicon thin film of claim 20; wherein said step of forming said first polysilicon layer comprises:
   forming a second amorphous silicon layer on said substrate;
   performing a second annealing process to fuse a portion of said second amorphous silicon layer, wherein the unfused portion of said second amorphous silicon layer is amorphous silicon grains set on the surface of said substrate; and
   performing a crystallization process using said amorphous silicon grains as crystallization seeds to form said first polysilicon layer.

* * * * *